United States Patent
Nemani (10) Patent No.: US 9,519,041 B2
(45) Date of Patent: Dec. 13, 2016

(54) SYSTEM AND METHOD FOR PROVIDING AN ACCURATE AND COST-EFFECTIVE CURRENT SENSOR CALIBRATION

(71) Applicant: Qualcomm Incorporated, San Diego, CA (US)

(72) Inventor: Mahadevamurty Nemani, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 107 days.

(21) Appl. No.: 14/465,767

(22) Filed: Aug. 21, 2014

(65) Prior Publication Data

US 2016/0054422 A1    Feb. 25, 2016

(51) Int. Cl.
    *G01R 35/00* (2006.01)
    *G01K 13/00* (2006.01)
    *G06F 1/26* (2006.01)

(52) U.S. Cl.
    CPC ............. *G01R 35/005* (2013.01); *G01K 13/00* (2013.01); *G06F 1/26* (2013.01)

(58) Field of Classification Search
None
See application file for complete search history.

(56) References Cited

U.S. PATENT DOCUMENTS

| | | | |
|---|---|---|---|
| 7,149,645 B2 | 12/2006 | Mangrulkar et al. | |
| 7,262,628 B2 * | 8/2007 | Southwell | H02M 3/1584 323/266 |
| 7,960,997 B2 | 6/2011 | Williams | |
| 8,604,777 B2 | 12/2013 | Doogue et al. | |
| 2004/0168095 A1 | 8/2004 | Yeh | |
| 2010/0153954 A1 | 6/2010 | Morrow et al. | |

(Continued)

OTHER PUBLICATIONS

Hussein A.I., et al., "Fully Integrated High Accuracy Continuous Current Sensor for Switching Voltage Circuits," 2014 IEEE 23rd International Symposium on Industrial Electronics (ISIE), IEEE, Jun. 1, 2014, (Jun. 1, 2014), pp. 497-502, XP032624058, DOI: 10.1109/ISIE.2014.6864663[retrieved on Jul. 24, 2014] the whole document.

(Continued)

*Primary Examiner* — Jermele M Hollington
*Assistant Examiner* — Douglas X Rodriguez
(74) *Attorney, Agent, or Firm* — Smith Tempel (57) ABSTRACT

Systems and methods for calibrating on-die analog current sensors are disclosed. The methods can be routinely applied to perform a calibration such as during a system initialization or boot procedure or during other times when the system is in a sleep or power saving mode of operation. The systems determine a leakage current in the device under present environmental conditions. A baseline load current determined under the present temperature and input voltage is retrieved and used to determine a total leakage current. A reproducible and stable dynamic load is controllably applied to provide a known current to the on-die analog current sensor. A third mechanism permits repeatable adjustments to the known current that span the operational range of the on-die integrated current sensor. The responsiveness of the disclosed mechanisms ensures that temperature induced leakage does not increase significantly during a current sensor calibration.

19 Claims, 7 Drawing Sheets

(56) References Cited

U.S. PATENT DOCUMENTS

2011/0226462 A1* 9/2011 Sato .................. G06F 1/206
 165/247
2012/0253726 A1 10/2012 Xu
2013/0124126 A1 5/2013 Ahuja et al.

OTHER PUBLICATIONS

International Search Report and Written Opinion—PCT/US2015/045314—ISA/EPO—Nov. 12, 2015.

* cited by examiner

SYSTEM AND METHOD FOR PROVIDING AN ACCURATE AND COST-EFFECTIVE CURRENT SENSOR CALIBRATION

DESCRIPTION OF THE RELATED ART

Many portable products, such as cell phones, laptop computers, personal data assistants (PDAs) and the like, utilize a processing system that executes programs, such as, communication and multimedia programs. A processing system for such products may include multiple processors, memory for storing instructions and data, controllers, peripheral devices, such as communication interfaces, and fixed function logic blocks configured, for example, on a single chip. At the same time, portable products have a limited energy source in the form of batteries that are often required to support high performance operations from the processing system. To increase battery life, when possible, it is desired to perform these operations at reduced power levels. Many personal computers are also being developed to support high performance operations at low power drain to reduce overall energy consumption.

Since the power associated with executing a task is a function of frequency, switching capacitance, and the square of the supply voltage, reducing power consumption requires a reduction in at least one of these variables. To more fully optimize power consumption in portable devices, some conventional processing systems control clock frequency and operating voltage in one or more circuit domains.

Due to the relatively demanding nature of various transient functions, such as video, other graphics, and communications, operating on portable devices, one or more processors and or processing systems may be required to operate at gigahertz frequencies in order to meet a product's real-time processing requirements. In addition, transient loads that exceed the maximum capability of a voltage regulator are to be avoided as an overload induced shutdown of a voltage regulator will often result in a system initialization procedure to reset the voltage regulator. Moreover, since the functional demands on the processing system can vary dramatically from low-power or sleep modes to high-power high demand modes of operation, sensors that provide information concerning a present condition generally must operate over a wide range of loads and under varying operational environments.

On-die analog current sensors have been deployed in various systems to provide real-time current data for power management. However, the accuracy of such on-die analog current sensors is sensitive to manufacturing variation. Furthermore, the accuracy of on-die analog current sensors varies significantly with load current and with temperature. With an understanding of the existence of these variations, one conventional approach to improve the accuracy of on-die analog current sensors is to perform a calibration routine before delivering the integrated circuit to an end user.

However, there are some problems with such die-level pre-delivery calibrations. First, the load response of on-die analog current sensors is nonlinear. This is the result of both manufacturing process variation and sensitivity to changes in temperature. Thus, a simple and inexpensive two-point calibration process performed prior to delivery can lead to significant errors when the integrated circuit is in use in a larger system under widely varying current loads and temperatures. Unfortunately, a multivariable calibration process that records data that enables corrections or adjustments for a wide range of current loads and temperatures can significantly increase a delivery cost per unit both due to the increased costs due to test time and the additional costs associated with storing parameters, algorithms or other corrective information on the die. Such expensive multivariable calibration tests cannot account for changes in sensor response as the sensor ages. Furthermore, test equipment may impose a maximum load current that is lower than may be desired, which could compromise accuracy at current loads that exceed test equipment imposed limits.

SUMMARY OF THE DISCLOSURE

Each of the alternative embodiments takes advantage of the inherent accuracy of a total capacitance of a controllably enabled/disabled clock network to generate an adjustable and reproducible dynamic load. Coupled with conventional mechanisms for adjusting one or both of clock frequency and input voltage, the adjustable and reproducible dynamic load can be controllably applied to generate a series of known load currents which can be recorded and used to generate a response curve for an integrated analog current sensor in a computing device.

One example embodiment includes a computing device with a mechanism for measuring a leakage current while clock inputs to a processor are disabled, a mechanism for retrieving a baseline current load as a result of operation of the processor at a present temperature and input voltage, a mechanism for determining a total leakage current as a function of the leakage current and the baseline current load, the total leakage current corresponding to a first data point, a mechanism for applying an adjustable dynamic load, a mechanism for measuring a load current, a mechanism for determining an applied current as a function of the total leakage current and the load current, the applied current corresponding to a second data point.

Another example embodiment includes a computing device with a processor, a memory element, a voltage source, an oscillator, a clock distribution network, an integrated analog current sensor, a set of registers and a thermal sensor. The memory element is coupled to the processor and has stored therein first, second and third modules. The voltage source and the oscillator are coupled to the processor and responsive to respective control signals. A first control signal adjusts the voltage at an output of the voltage source. A second control signal adjusts the frequency of a time-varying output of the oscillator. The clock distribution network is controllably enabled or disabled via a set of enable signals generated in the processor. The integrated analog current sensor is coupled to the processor and the clock distribution network. The set of registers are available for storing a total leakage current determined from a present input voltage and temperature as determined from the thermal sensor and one or more representations of a measured current and an applied current.

An alternative embodiment includes a non-transitory computer-readable medium, having modular instructions stored therein. The computer-readable medium includes a clock source module, a leakage module, a load generator module, a load current module, a measurement module, and an applied current module. The clock source module is arranged to controllably enable/disable an oscillator. The leakage module is arranged to measure a leakage current and retrieve a baseline current load corresponding to a present input voltage and measured temperature. The load generator module is arranged to configure and apply a dynamic load. The load current module is arranged to calculate and record a dynamic load current. The measurement module is arranged to measure and record a representation of the load current. The applied current module is arranged to calculate and record an applied current as a function of the total leakage current and the dynamic load current.

Another example embodiment is a method for calibrating an integrated current sensor in a computing device. The computing device records at least one measured parameter indicative of leakage current (e.g., a measured temperature or a provided supply voltage), calculates a leakage current responsive to the at least one measured parameter, uses a clock network responsive to a first input signal and a second input signal to generate a dynamic load, generates an estimate of the dynamic current load responsive to capacitance of the clock network, generates a total current applied responsive to the leakage current and the estimate of the dynamic load, records the total current applied, adjusts the second input signal, and repeats the measuring, generating, adjusting and recording steps a desired number of times.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files or data values that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer-readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the term "portable computing device" or PCD is used to describe any device operating on a limited capacity rechargeable power source, such as a battery and/or capacitor. Although PCDs with rechargeable power sources have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop or tablet computer with a wireless connection, among others.

Although preferred embodiments include a portable computing device with on die current sensors, the present systems and methods for calibrating on die current sensors can be adapted for non-portable computers such as desktop and server computers. In addition, the disclosed systems and methods are illustrated and described in conjunction with an initialization or boot process on a host computing device. However, skilled individuals will be able to readily adapt the disclosed concepts and techniques to calibrate current sensors at select times other than during a system initialization or boot. Systems and methods for calibrating on-die analog current sensors are disclosed. The systems can be arranged to routinely perform a calibration such as during a system initialization or boot procedure or during other times when the system is in a sleep or power saving mode of operation. Described embodiments include a first mechanism for establishing leakage current in the device under present environmental conditions. A second mechanism establishes or provides a reproducible and stable dynamic current that can be applied to an integrated current sensor. A third mechanism permits repeatable adjustments to the known current that span the operational range of the integrated current sensor. The responsiveness of the first and third mechanisms ensures that temperature induced leakage does not increase significantly during a current sensor calibration.

Furthermore, the responsiveness of the first and third mechanisms permits the collection of a relatively large number of data points in a relatively brief period of time. Consequently, the calibration procedure can significantly improve calibration accuracy without adversely impacting the time it takes to complete a boot or initialization procedure. Not only is calibration accuracy improved in an economical manner, by performing the calibrations on a computing device, any age related variation in current sensor accuracy is rendered moot.

Figure 1:
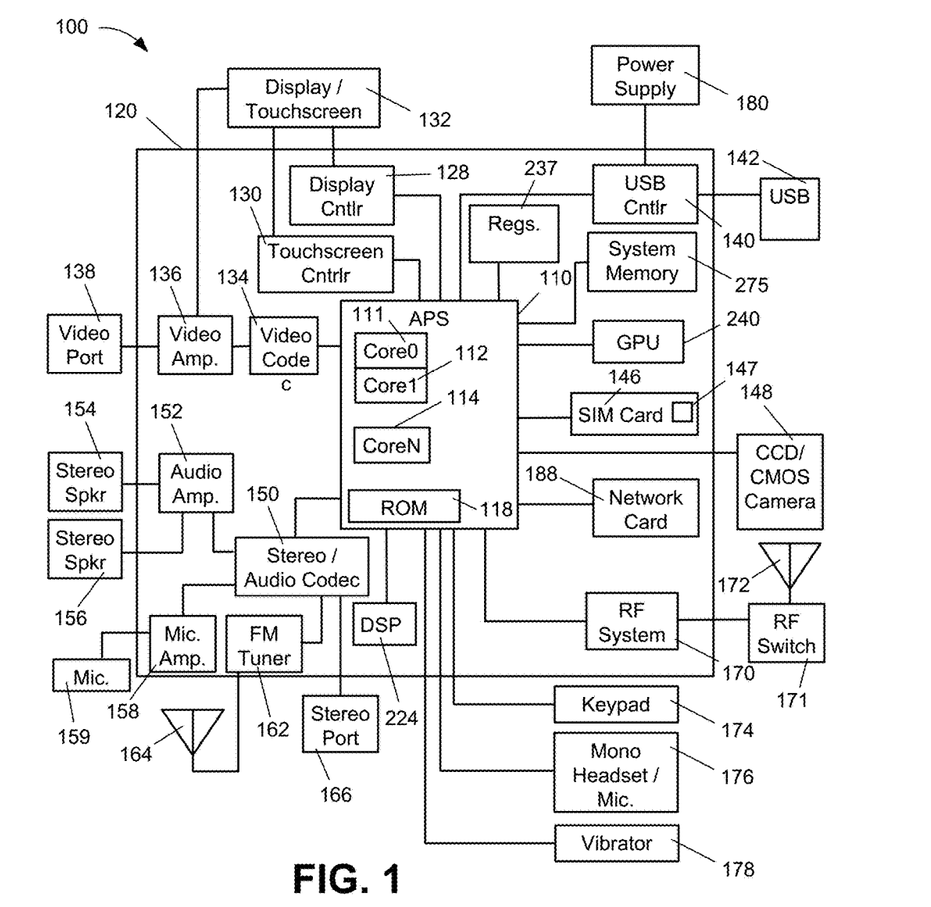
FIG. 1 is a schematic diagram illustrating an example embodiment of a computing device.

Reference is now directed to the illustrated examples. Referring initially to FIG. 1, an exemplary, non-limiting aspect of a portable computing device (PCD) is shown and is generally designated 100. As shown, the PCD 100 includes a system-on-chip (SoC) 120 that includes a multi-core CPU or application processing system (APS) 110. The APS 110 includes a zero$^{th}$ core 111, a 1$^{st}$ or first core 112, and an N$^{th}$ core 114. The cores or processing resources 111-114 are shared processing resources that support the execution of an operating system, background functions, and one or more applications or programs on the PCD 100. The APS 110 works in conjunction with instructions and data stored in read-only memory (ROM) 118 to initialize or configure the PCD 100 upon applying power to the various elements from power supply 180. Once initialized, the APS 110, communicates with a set of registers 237 and a system memory 275. The set of registers 237 is available for storing and retrieving system configuration information as well as storing calibration results. The system memory 275 is available for storing application programs, files, application configuration and other information that is controllably retrieved and executed by the APS 110.

The PCD 100 includes a number of other processing resources that are enabled as may be required after the APS 110 is active. In the illustrated embodiment, the other processing resources include but are not limited to a digital signal processor (DSP) 224, a graphics processing unit (GPU) 240, Stereo/Audio Codec 150, Video Codec 134, among other processors in the SoC 120.

As illustrated in FIG. 1, a display controller 128 and a touch screen controller 130 are coupled to the APS 110. In turn, display/touchscreen 132, external to the SoC 120, is coupled to the display controller 128 and the touch screen controller 130. A video CODEC 134, e.g., a phase alternating line (PAL) encoder, a sequential couleur a memoire (SECAM) encoder, or a national television system(s) committee (NTSC) encoder, is coupled to the APS 110. Further, a video amplifier 136 is coupled to the video CODEC 134 and the display/touchscreen 132. Also, a video port 138 is coupled to the video amplifier 136. As depicted in FIG. 1, a universal serial bus (USB) controller 140 is coupled to the APS 110. Also, a USB port 142 is coupled to the USB controller 140. A set of registers 237, a system memory 275, and a subscriber identity module (SIM) card 146 with a corresponding SIM store 147 may also be coupled to the APS 110. Further, as shown in FIG. 1, a digital camera 148 may be coupled to the APS 110. In an exemplary aspect, the digital camera 148 is a charge-coupled device (CCD) camera or a complementary metal-oxide semiconductor (CMOS) camera.

As further illustrated in FIG. 1, a stereo audio CODEC 150 may be coupled to the APS 110. Moreover, an audio amplifier 152 may be coupled to the stereo audio CODEC 150. In an exemplary aspect, a first stereo speaker 154 and a second stereo speaker 156 are coupled to the audio amplifier 152. The illustrated embodiment shows that a microphone amplifier 158 may be also coupled to the stereo audio CODEC 150. Additionally, a microphone 159 may be coupled to the microphone amplifier 158. In a particular aspect, a frequency modulation (FM) radio tuner 162 may be coupled to the stereo audio CODEC 150. Also, a FM antenna 164 is coupled to the FM radio tuner 162. Further, a stereo port 166 may be coupled to the stereo audio CODEC 150.

FIG. 1 also indicates that a radio frequency (RF) system 170 or transceiver is coupled to the APS 110. An RF switch 171 may be coupled to the RF system 170 and an RF antenna 172. As shown in FIG. 1, a keypad 174 is coupled to the APS 110. Also, a mono headset with a microphone 176 may be coupled to the APS 110. Further, a vibrator device 178 may be coupled to the APS 110. FIG. 1 further shows that a power supply 180 is coupled to the SoC 120 via the USB controller 140. In a particular aspect, the power supply 180 is a direct current (DC) power supply that provides power to the various components of the PCD 100 that require power. Further, in a particular aspect, the power supply is a rechargeable DC battery or a DC power supply that is derived from an alternating current (AC) to DC transformer that is connected to an AC power source (not shown).

FIG. 1 further indicates that the PCD 100 may also include a network card 188 that may be used to access a data network, e.g., a local area network, a personal area network, or any other network. The network card 188 may be a Bluetooth network card, a WiFi network card, a personal area network (PAN) card, or any other network card well known in the art. Further, the network card 188 may be incorporated in an integrated circuit. That is, the network card 188 may be a full solution in a chip, and may not be a separate network card 188.

As depicted in FIG. 1, the display/touchscreen 132, the video port 138, the USB port 142, the camera 148, the first stereo speaker 154, the second stereo speaker 156, the microphone 159, the FM antenna 164, the stereo port 166, the RF switch 171, the RF antenna 172, the keypad 174, the mono headset 176, the vibrator 178, and the power supply 180 are external to the SoC 120.

RF system 170 or transceiver, which may include one or more modems, may support one or more of global system for mobile communications ("GSM"), code division multiple access ("CDMA"), wideband code division multiple access ("W-CDMA"), time division synchronous code division multiple access ("TDSCDMA"), long term evolution ("LTE"), and variations of LTE such as, but not limited to, FDB/LTE, PDD/LTE, and future wireless protocols.

In the illustrated embodiment, a single instance of an APS 110 is depicted. However, it should be understood that any number of similarly configured APSs can be included to support the various peripheral devices and functions associated with the PCD 100. Alternatively, a single processor or multiple processors each having a single arithmetic logic unit or core could be deployed in a PCD or other computing devices to support the various peripheral devices and functions associated with the PCD 100 as may be desired.

In a particular aspect, one or more of the method steps described herein may be enabled via a combination of data and processor instructions stored in the ROM 118, the set of registers 237 and/or the system memory 275. These instructions may be executed by the APS 110 or one or more of the other processing resources in order to perform the methods described herein. The APS 110 or one or more of the other processing resources operates in conjunction with information retrievable from fuses 233, temperature sensors 231, 244, and current sensors 232, 246 to controllably calibrate these on die current sensors 232, 246 over a desired range of load conditions. Further, the APS 110, ROM 118, registers 237, system memory 275, an EEPROM (not shown) or a combination thereof may serve as a means for storing a non-transitory representation of calibration logic, including resource state logic, and configuration parameters for executing one or more of the method steps described herein.

Figure 2A:
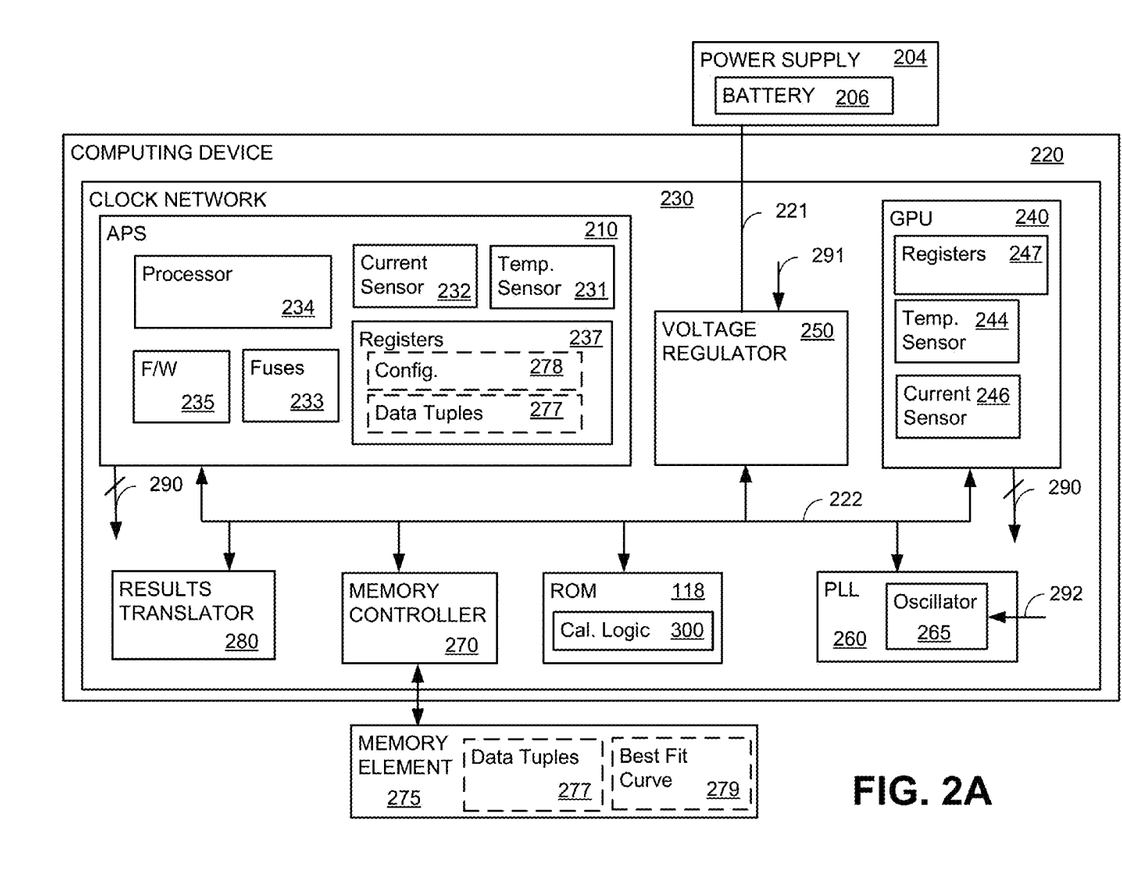
FIG. 2A is a schematic diagram illustrating an alternative embodiment of a computing device.

FIG. 2A is a schematic diagram illustrating an alternative embodiment of a computing device 220. As indicated in the illustrated embodiment, the computing device 220 is powered by a power supply 204 which includes one or more batteries such as battery 206. The computing device 220 is communicatively coupled to a memory element 275 or system memory 275 that provides data storage capacity for data collected during a calibration process (e.g., data tuples 277) as well as results (e.g., information that defines or describes a piece-wise linear results curve, information 279 that defines or describes a best fit curve, etc.) calculated or derived from the stored data.

The computing device 220 includes ROM 118, APS 210, GPU 240, voltage regulator 250, memory controller 270 and a results translator 280 interconnected to one another by bus 222. The voltage regulator 250 receives a supply voltage from the battery 204 on connection 221 and in accordance with a control signal on connection 291 provides a desired regulated voltage via bus 222 to other elements in the computing device 220. Although the voltage regulator 250 is embodied as a separate and distinct circuit element in the computing device 220, in alternative arrangements a voltage regulator can be integrated into other circuits such as the APS 210 and the GPU 240. Moreover, the voltage regulator 250 may provide multiple supply voltages with a first supply voltage at a first magnitude distributed to a first set of circuits and one or more alternative supply voltages being distributed to other circuits or elements as may be desired. The one or more supply voltages provided by the voltage regulator 250 are examples of an environmental or operational parameter, namely, a voltage in a power domain.

The memory controller 270 is arranged to manage the flow of data going to and from the system memory 275. Data going to and from the system memory 275 can include data tuples 277 and information defining a best fit curve 279 derived or calculated from the data tuples 277. Data going to and from the system memory 275 by way of the memory controller 270 may further include temporary configuration information, files, application programs, etc. (not shown). Like the voltage regulator 250, the memory controller 270 is embodied as a separate and distinct circuit element in the computing device 220. However, in alternative arrangements, the memory controller 270 can be integrated in the APS 210 or in some cases the memory element 275.

The APS 210 works in conjunction with instructions and data stored in read-only memory (ROM) 118 to initialize or configure the computing device 220 upon applying power to the various elements from power supply 204. Once initialized, the APS 210, communicates with a set of registers 237 and the system memory 275 in addition to the ROM 118. The set of registers 237 is available for storing and retrieving system configuration information as well as storing calibration results. The system memory 275 is available for storing application programs, files, application configurations that are controllably retrieved and executed by the APS 110 as desired.

As illustrated in FIG. 2A, the APS 210 is arranged with a temperature sensor 231, a current sensor 232, fuses 233, firmware 235 as well as the set of registers 237. The temperature sensor 231 and the current sensor 232, when enabled or otherwise directed by the processor 234 forward a signal that varies in accordance with the temperature of the environment surrounding the temperature sensor 231, or in the case of the current sensor 232, the current flowing through a conductor or circuit element coupled to the sensor. The respective signals generated by the temperature sensor 231 and the current sensor are converted by an analog-to-digital converter (ADC) (not shown) and a raw or encoded digital value in the form of bits is transferred to a corresponding register in the set of registers 237. Although the illustrated arrangement shows a single implementation of a temperature sensor 231 and a current sensor 232, additional instances of these sensors may be distributed throughout the APS 210, the GPU 240, and the other circuit elements of the computing device 220 as desired. The one or more temperature sensors (231, 244) measure an environmental parameter, namely a localized temperature.

The fuses 233 are a circuit elements that provides a mechanism for communicating configuration information such as a baseline leakage current present in the computing device 220 when the computing device 220 is operated at a particular input voltage and temperature. The leakage current value identified in the fuses 233 may be a theoretical leakage current generated by a model of the computing device or may include information recorded from a manufacturing level test of individual circuit blocks or processing cores.

In alternative arrangements, one or more of the fuses 233, firmware 235 and the set of registers 237 can be arranged in other locations on the computing device 220 in communication with the processor 234. Firmware 235 includes persistent memory (e.g., embedded flash memory, a read-only memory (ROM), a programmable read-only memory (PROM), etc. and the instructions and data stored therein. Firmware 235 can be arranged with one or more sets of controls or instruction sets that when executed by the processor 234, direct the computing device 220 to perform desired functions. Thus, firmware 235 provides an alternative location for one or more of the calibration logic 300 and configuration information stored in the fuses 233.

The GPU 240 is a specialized circuit arranged to accelerate the generation of image elements that are communicated to a frame buffer on their way to a display. The GPU 240 may be arranged with a dedicated memory element and controller (both not shown) for temporarily storing image elements before forwarding the image elements to the frame buffer. In the illustrated arrangement, the GPU 240 is arranged with at least one temperature sensor 244, at least one current sensor 246, and a set of registers 247. The set of registers 247 provide storage capacity for data received from the temperature sensor 244, the current sensor 246 or both of these devices.

The computing device 220 operates in accordance with a distributed clock network 230. The clock network 230 receives and distributes one or more clock signals generated by a managed clock source such as phase-locked loop (PLL) 260 to the various circuit elements within the computing device 220. The PLL 260 includes oscillator 265, which provides a periodic time-varying signal source to the PLL 260 that operates at a frequency corresponding to a signal voltage applied on connection 292. The PLL 260 is a control system that generates an output signal whose phase is related to a phase of an input signal. The PLL 260 is in a locked condition when the frequency and phase of an input signal are equal to the frequency and phase of a feedback signal. The clock network 230 is arranged using an architecture that provides one or more clock signals into local regions of the computing device 220. The clock network architecture includes transmission lines, drivers or other signal conditioning elements and logic driven integrated circuit elements that can be controllably addressed to enable or disable the clock network 230 as desired. The clock network 230 is responsive to control signals communicated on connections 290 from one or both of the APS 210 and the GPU 240.

The control signals are connected to one or more mechanisms that can be used separately or together to disable the clock network 230. For example, the clock network 230 can be disabled by removing an input voltage from the oscillator 265 and/or opening the respective connections from the output of the PLL 260 to corresponding trunks of the clock network. One or more circuit elements is strategically arranged to verify that the clock network 230 is disabled. These elements may detect the presence of a time-varying signal in a transmission line on a trunk, branch or other conductor in the clock network. Alternatively, these elements may check the on/off status (i.e., an enabled or disabled condition) of one or more drivers or logic circuits distributed in the clock network 230.

The computing device 220 operates in accordance with calibration logic 300 stored in the ROM 118. The calibration logic 300 is loaded into the processor 234. When the calibration logic 300 is executed, the computing device 220 controllably generates signals that when communicated to the voltage regulator 250, PLL 260, oscillator 265, clock network 230, temperature sensors 231, 244, current sensors 232, 246, and storage elements direct these elements to collect and store data that can be used in interim calculations to perform an accurate and cost-effective current sensor calibration. The calibration procedure can be performed each time the computing device 220 is reset or receives power after being in a power-off condition. A results translator 280 is a circuit or set of circuit elements arranged to collect and expose the data collected during the calibration. For example, the results translator 280 may be arranged to collect the stored data tuples 277 and use the same to generate a line segment in slope intercept form to describe the response of a select current sensor over a range of currents corresponding to the line segment. A next subsequent line segment and additional line segments can similarly be generated to represent the responsiveness of the corresponding current sensor over the entire operational range of the sensor.

Figure 2B:
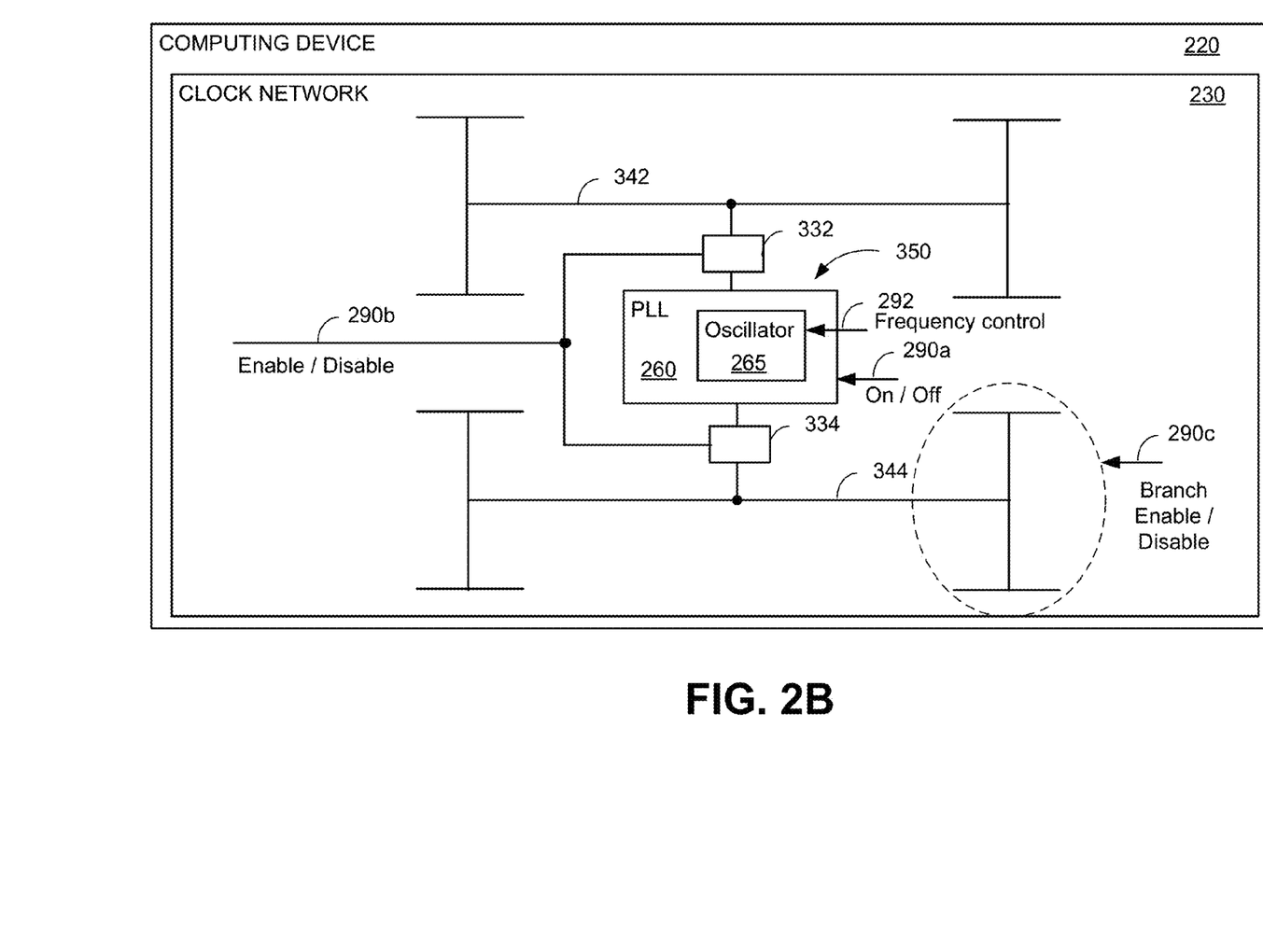
FIG. 2B is a schematic diagram illustrating an embodiment of a clock network.

FIG. 2B is a schematic diagram illustrating an embodiment of the clock network 230 introduced in FIG. 2A. The various branches and elements of the clock network 230 are illustrated schematically. A managed clock source 350 includes PLL 260 and oscillator 265. The managed clock source is responsive to an on/off signal communicated on connection 290*a* and a frequency control signal applied on connection 292. The on/off signal applies an operating voltage at an input of the managed clock source 350. The frequency control signal on connection 292 provides a variable voltage at an input of the oscillator 265. The oscillator 265 generates a periodic time-varying signal at a desired frequency in response to the voltage of the input signal. The PLL 265 receives the periodic time-varying signal from the oscillator and controls or limits any variation in phase as desired.

The managed clock source 350 is coupled to a distribution branch 342 and a distribution branch 344. While a single managed clock source 350 is illustrated together with two distribution branches, other arrangements may include a desired number of clock sources coupled to any number of distribution branches. As indicated in the illustrated embodiment, a clock network enable/disable signal applied on connection 290*b* may direct a trunk element 332 and a trunk element 334 to disable or prevent communication of the clock signal in branch 342 and branch 344, respectively. As further indicated in FIG. 2B, a branch enable/disable signal on connection 290*c* is applied at one or more drivers, or logical elements (not shown) distributed about the clock network 230 to controllably disable portions of the clock network 230. Additional, enable/disable signals may be applied at any number of lower levels in a hierarchically arranged clock distribution network (not shown). The described trunk and branch enable/disable signals applied on connection 290*b* and 290*c* are examples of gating controls. That is, controls that enable or disable the clock distribution network.

Figure 3:
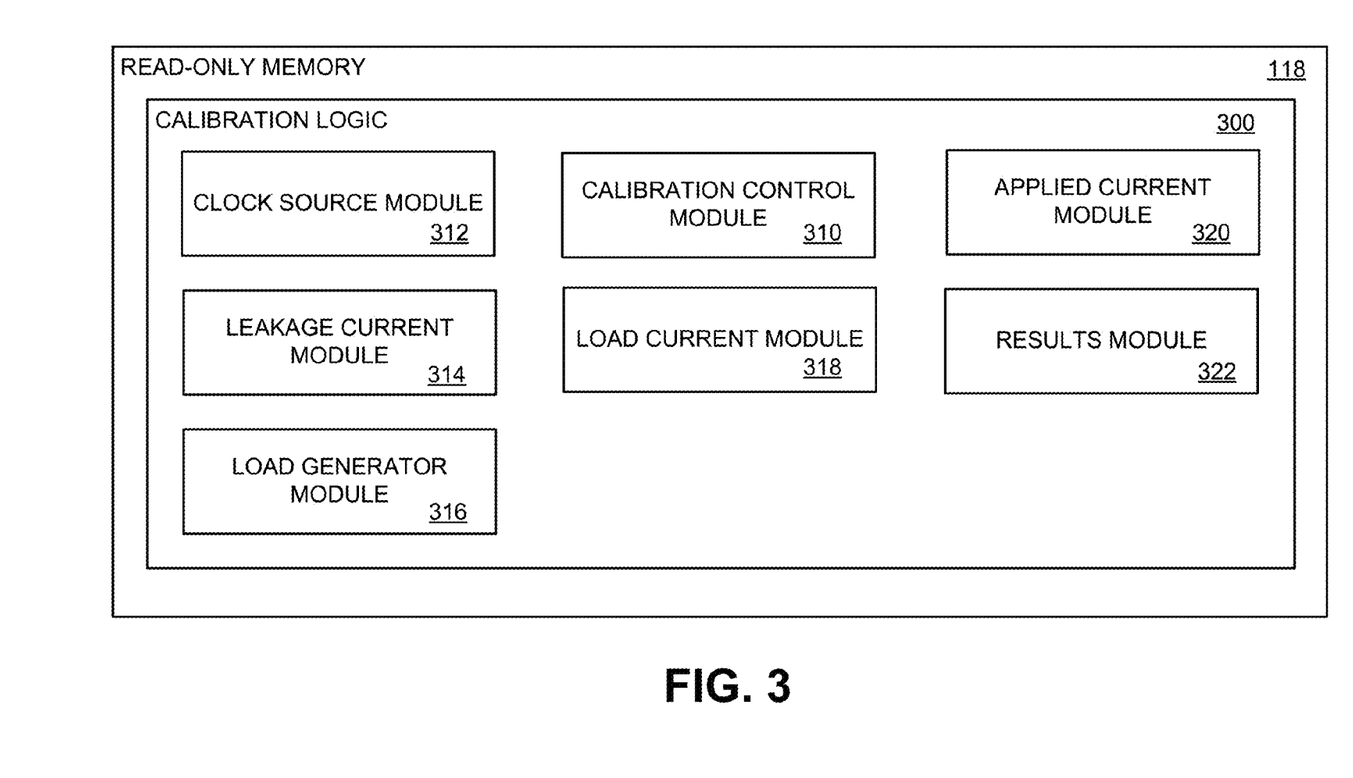
FIG. 3 is a schematic diagram illustrating an example embodiment of logic stored in a computer-readable medium that can be read by the computing device of FIG. 1.

FIG. 3 is a schematic diagram illustrating an example embodiment of calibration logic 300 stored in a non-transitory computer-readable medium such as ROM 118 that can be read by the APS 110 of FIG. 1 or the computing device 200 of FIG. 2. As indicated in the illustrated embodiment, the calibration logic 300 includes calibration control module 310, clock source module 312, leakage current module 314, load generator module 316, load current module 318, measurement module 320, applied current module 322, and results module 324.

The calibration control module 310 includes instructions that when executed by a processor 234 direct the processor 234 to determine from one or more configuration criteria (available in firmware, registers, or other storage locations) an appropriate number of data points to describe a results curve from an integrated analog current sensor as determined by the described methods. The one or more configuration criteria may include an identifier of the type of analog current sensor, an expected current range of use, a minimum current value that can be detected using the defined current sensor, a maximum current value that can be measured without damaging the current sensor, an elapsed time available to complete the current sensor calibration, among others. The calibration control module 310 will also coordinate the application of clock source module 312, leakage current module 314, load generator module 316, load current module 318, and applied current module 320, at appropriate times to manage the processing flows described in one or both of FIG. 4 and FIG. 5. A results module 322 is available to generate and provide an accurate piece-wise linear calibration result curve generated in a delivered device.

The clock source module 312 includes instructions that when executed by processor 234 direct the processor to develop a control signal communicated on connection 292 to adjust the output frequency of an oscillator and a signal that controllably enables/disables a clock network 230 in the computing device 220.

The leakage current module 314 includes instructions that when executed by processor 234 direct the computing device 220 to poll or retrieve a representation of a present input voltage being supplied to the processor 234 by a voltage regulator 250 and one or more temperatures associated with respective temperature sensors (231, 244) distributed about the computing system 220. In addition, the leakage current module 314 includes instructions that when executed by the processor 234 direct the computing device 220 to retrieve a baseline leakage current as stored in a set of fuses 233. As indicated, the baseline leakage current is determined during a manufacturing test of individual circuit blocks or processing cores over a range of input voltages and a range of operating temperatures. A value representing a leakage current for each of a desired number of environmental combinations is determined during the manufacturing test and is stored in a set of fuses or an alternative read-only memory provided to store the information. The retrieved leakage current value may be temporarily stored in a cache or other buffer in communication with the processor 234.

The load generator module 316 includes instructions that when executed by processor 234 direct the computing device 220 to disable the clock network, adjust the control input to an oscillator 260, and wait for an indication that a PLL 265 has achieved a lock condition before enabling the clock network 230. The adjustment to the control input of the oscillator 260 can be a change expected to result in a desired step in the frequency of the oscillator output signal. The calibration control module 310 will determine the magnitude of the step adjustment in response to the range of the sensor being calibrated and the number of calibration points desired. The calibration control module 310 may include logic that determines the magnitude of the step adjustment based on one or both of the time permitted and the storage capabilities of the computing device 220. The load current module 318 include instructions that when executed by processor 234 direct the computing device 220 to poll one or more current sensors 232, 246 distributed about the computing device 220 and record a digital value from an ADC coupled to the respective sensor in a cache, storage register or an addressable storage location coupled to the processor 234. The applied current module 320 includes instructions that when executed by processor 234 direct the computing device 220 to calculate an applied current as a function of the leakage current and the load current and store an applied current value or result of the calculation in a desired cache, register or addressable storage location coupled to the processor 234. Each time the load is adjusted (i.e., increased or decreased) a subsequent applied current value is determined. The collection of the calculated applied current values coupled with the corresponding raw current sensor data form a set of calibration data points.

The results module 322 includes instructions that when executed by processor 234 direct the computing device 220 to calculate and store information in an addressable memory such as a system memory 275. The stored information can be in the form of data tuples 277, a best fit curve, 279, or piece-wise linear segments over a select range of operation (i.e., a subset of the entire operational range of the current sensor(s)) or over the entire range of operation of the current sensor(s).

Figure 4:
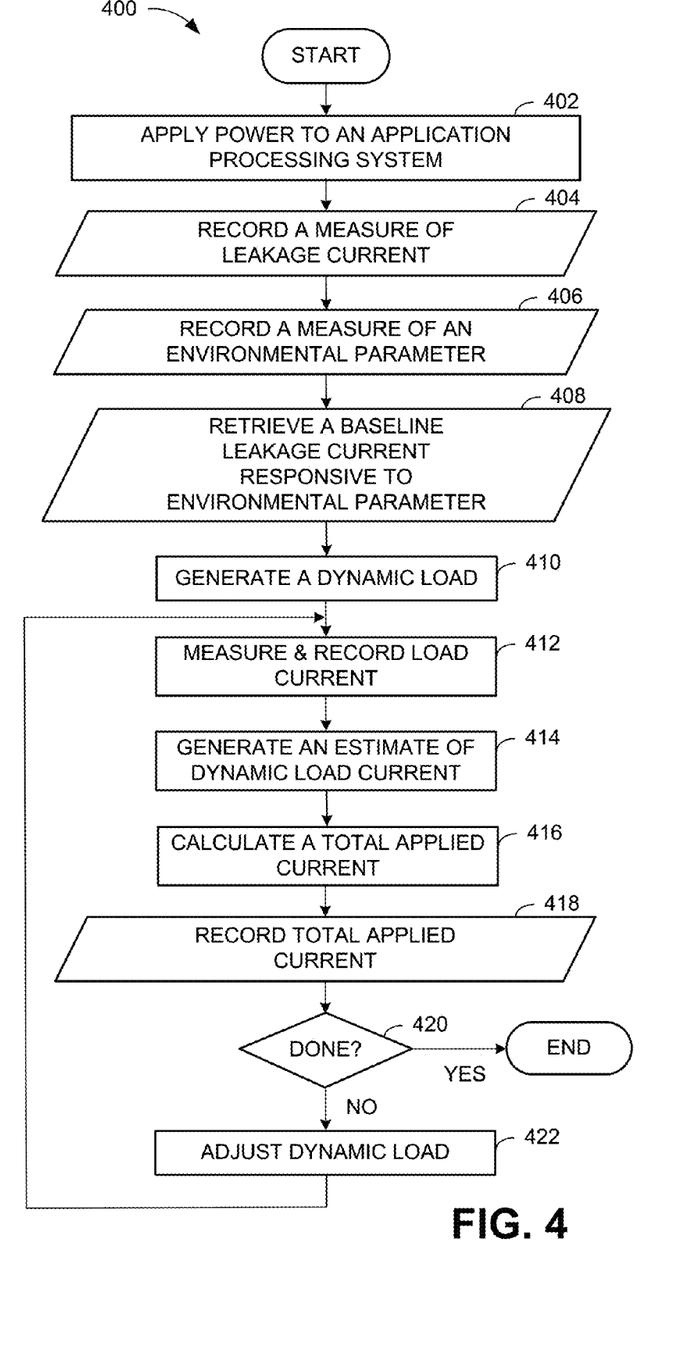
FIG. 4 is a flow diagram illustrating an example embodiment of a method for calibrating an integrated analog current sensor in the computing device of FIG. 1.

FIG. 4 is a flow diagram illustrating an example embodiment of a method 400 for calibrating an integrated analog current sensor in the computing device 100 of FIG. 1. The method 400 begins with block 402 where power is applied to an application processing system such as APS 110. After completion of a primary boot sequence the separate cores or processors, e.g., Core0 111, Core1 112, . . . , CoreN 114 can be checked to ensure they are powered "on" and operating in accordance with a reset mode of operation. For a SoC 120 that uses an asynchronous reset methodology the clock network 230 is not enabled upon the initial application of power to the APS 110. For a SoC 120 that uses a synchronous reset methodology upon completion of the reset the clock network 230 will be disabled.

Next, as indicated in input/output block 404, a measure of leakage current is recorded. For example, in accordance with instructions in a leakage current module 314 of the calibration logic 300, one or more current sensors 232, 246 will be polled to measure a present leakage current. That is, a digital code provided by an analog-to-digital converter (ADC) coupled to the one or more current sensors will provide a digital representation of a present current flowing through the associated circuit elements. The one or more digital representations of the leakage current are stored in respective registers 237.

As indicated in input/output block 406, a measure of a parameter is recorded. For example, in accordance with instructions from the leakage current module 314, one or more temperature sensors 231, 244 are polled to measure a present temperature of the various processing resources. A respective digital code provided by an ADC coupled to the one or more temperature sensors 231, 244 will provide a corresponding digital representation of a present temperature of the APS cores 111, 112, 114 or GPU 240. The one or more digital representations of the temperature(s) are stored in respective registers 237. In addition to recording the one or more digital representations of the present temperature(s) in a respective register in the set of registers 237, an input voltage being presently applied at an input of the APS cores 111, 112, 114 or GPU 240 can also be similarly stored in a respective register.

As indicated in input/output block 408, a baseline leakage current responsive to the environmental parameter (one or both of the temperature and the input voltage) can be retrieved from a set of fuses 233 to provide a baseline leakage current corresponding to the application APS cores 111, 112, 114 or GPU 240 as previously measured under the present temperature and operating voltage. That is, the values or information stored in the fuses 233 is in accordance with a manufacturing test of the individual processing resources. A first flag or bit can be used to identify a present temperature. A second flag or bit can be used to identify an input voltage. Alternatively, one or more programs executing in the APS 210 may be aware of the input voltage being provided by the voltage regulator 250. The flags or bits can be used to identify a baseline leakage current by registration with respect to a stored value or by identifying an address where the corresponding baseline leakage current is stored. The baseline leakage current together with the measured leakage current from input/output block 404 provides a first data point for a calibration of the one or more current sensors.

Thereafter, as indicated in block 410, a dynamic load is generated. When the processing resources (e.g., the APS 110, GPU 240) are in a reset mode of operation, the processing resources are not manipulating data. Under these circumstances, a controllable dynamic load is generated by enabling a clock network 230 and adjusting one or both of the applied voltage and clock source frequency. For a given integrated circuit manufacturing process, the capacitance of a clock network is known during the design phase and can be verified through a post-silicon characterization. Thus, for a given input voltage and clock frequency, a calculation can be used to identify a dynamic load current. Preferably, after a select input voltage is applied to the corresponding processing resource (with the processing resource in a reset mode of operation and the clock network disabled) a load generation module 316 is arranged to enable an oscillator 265 and a corresponding phase-locked loop (PLL) 260. After a PLL lock condition is achieved, the clock network is enabled (that is, clock network logic coupled to sequential elements in the computing system 220 is enabled). The resulting load is constant (for a given clock network capacitance, input voltage and clock frequency) and process variation independent.

As indicated in block 412, a load current is measured and recorded. For example, in accordance with instructions in a load current module 318 of the calibration logic 300, one or more current sensors 232, 246 will be polled to measure a present load current. That is, a digital code provided by an ADC coupled to the one or more current sensors will provide a digital representation of a present current flowing through the associated circuit elements. The one or more digital representations of the load current(s) are stored in respective registers 237. As shown in block 414, an estimate of the dynamic current component of the total or applied current is calculated as a function of the clock network capacitance, input voltage and clock frequency. In block 416, the total or applied current is generated as a function of the leakage current retrieved in block 408 and the dynamic load current generated in block 414. That is, the APS 210 calculates or is capable of calculating an applied current by mathematical methods. The total or applied current generated in block 416 is recorded, as shown in input/output block 418. The measured load current from block 412 and the total or applied current from block 416 correspond to a subsequent calibration point. In decision block 420, a determination is made whether all desired calibration points have been completed. When this is not the case, the dynamic load is adjusted, as indicated in block 422 and the functions associated with blocks 412 through 418 are repeated until a desired number of calibration points have been recorded. Thus, the computing device 220 and more specifically the APS 210 of the computing device 220 is capable of repeating the measuring (412), generating (414), recording (418) and adjusting (422) steps a desired number of times. A calibration control module 310 provides logic that controllably adjusts the dynamic load across a range of load currents in accordance with a desired step or change in input voltage or frequency applied to the clock network 230.

Once all desired measurements are completed, the calibration control module 310 may signal or direct a results module 324 to calculate a piece wise linear best fit curve in response to the recorded data tuples 277. While the results module 324 is active the calibration control module 310 may direct the APS cores 111, 112, 114 to complete the remainder of a reset or initialization procedure.

Figure 5:
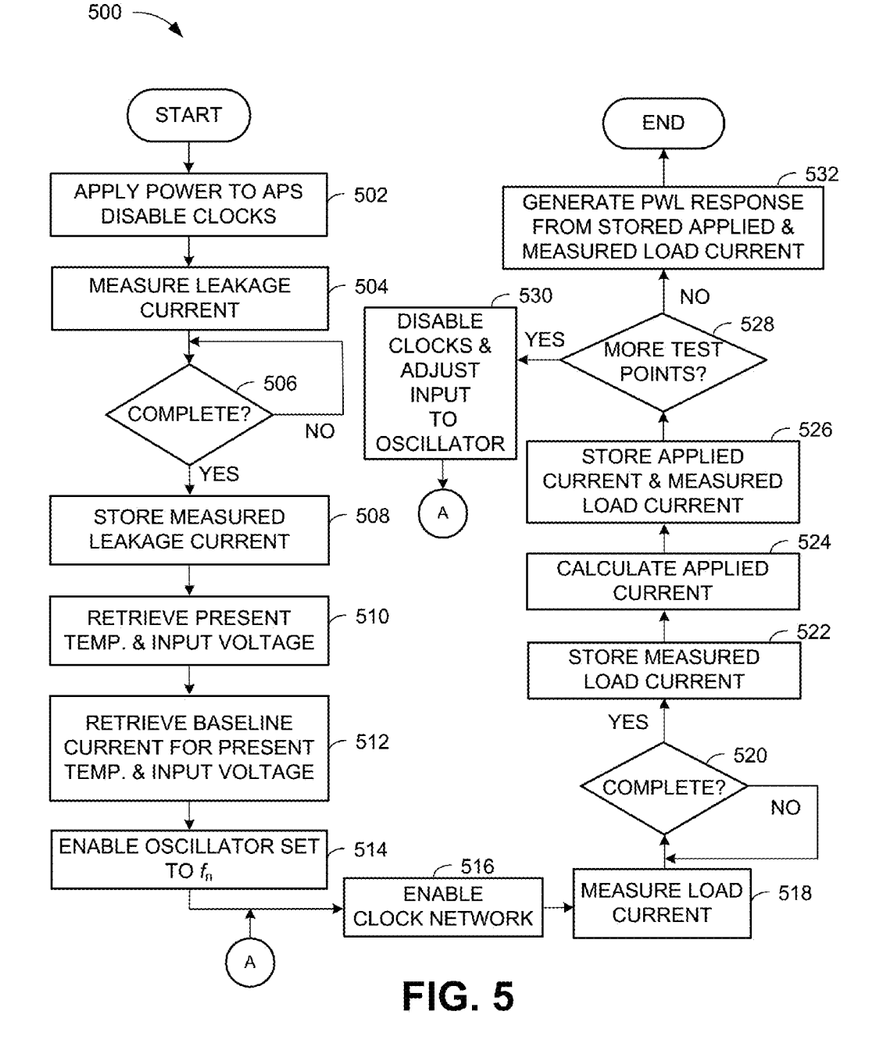
FIG. 5 is a flow diagram illustrating an alternative embodiment of a method for calibrating an integrated analog current sensor in the computing device of FIG. 1.

FIG. 5 is a flow diagram illustrating an alternative embodiment of a method 500 for calibrating an integrated analog current sensor (232, 246) in the computing device 100 of FIG. 1. The method 500 begins with block 502, where clock signals are disabled and power is applied to a processing resource such as the APS 110 or the GPU 240. In block 504, leakage current is measured with an integrated current sensor. A determination is made in decision block 506, when the leakage current measurement is complete. In block 508, the measured leakage current is stored. In block 510, a present temperature and input voltage are retrieved. In block 512, the temperature and input voltage from block 510 are used as an index to retrieve a baseline leakage current. In block 514, an oscillator is enabled and directed to oscillate a desired frequency. In block 516, a clock network 230 is enabled. As described above, the clock network 230 can be enabled after a determination that a PLL 260 is operating in a locked state. Thereafter, in block 516, a load current is measured. A determination is made in decision block 518, when the load current measurement is complete. In block 520, the measured load current is stored. In block 522, an applied current is calculated as a function of the leakage current and the load current. In block 524, the measured load current and the applied current, representing a subsequent data point, are stored. In decision block 526, a determination is made as to whether more test points are to be recorded. When this is the case as identified by the flow control arrow labeled "Yes," exiting block 526, the clock network is disabled and the input to the oscillator is adjusted to modify the output frequency of the oscillator, as indicated in block 528. Thereafter, processing continues with the functions associated with block 516 through block 528. Otherwise, when the desired number of test points have been processed, the method 500, generates a piece-wise linear response from the stored data points, as indicated in block 532.

Figure 6:
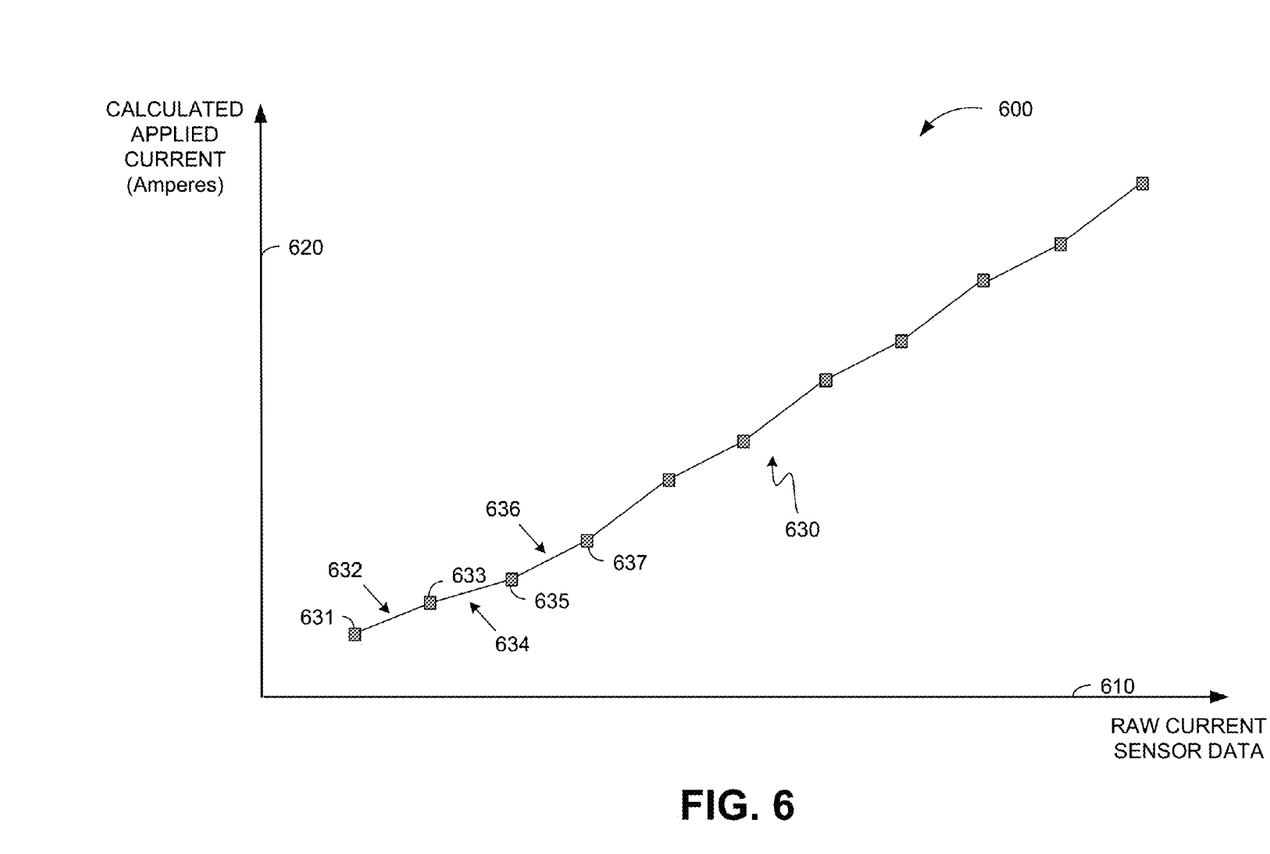
FIG. 6 is a plot illustrating a results curve generated from stored calibration points.

FIG. 6 is a plot 600 illustrating a results trace 630 generated from stored calibration points (631, 633, 635, . . . ) represented symbolically along the trace 630 with shaded squares. The abscissa or x-axis 610 represents a raw or encoded value from an ADC coupled to an integrated analog current sensor. The ordinate or y-axis 620 represents the applied current as calculated from the sum of the total leakage current and dynamic load current. Thus, each data point includes a first component of a raw current sensor data value and a second component of a calculated applied current value or corresponding applied current. The results trace 630 is a piece-wise linear (PWL) representation of raw sensor data vs. applied current. A line segment 632 can be identified by a first end point 631 and a second end point 633. An adjacent line segment 634 can be identified by end point 633 and end point 635. Similarly, a next subsequent line segment 636 can be identified by end point 635 and end point 637. Alternatively, line segment 632 or any other segment or portion of the results trace 630 can be represented as a slope and an intercept. The slope is the change in the ordinate dimension (commonly referred to as the y direction) divided by the change in the abscissa dimension (commonly referred to as the x direction). Thus, the slope or $$m = \frac{y_2 - y_1}{x_2 - x_1}$$

can be determined from point 633 represented as $(x_2, y_2)$ and point 631 represented as $(x_1, y_1)$. The y-intercept can be determined by inserting the slope m as determined above into the equation y=mx+b.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or in parallel (substantially simultaneously) with other steps without departing from the scope of the invention. In some instances, certain steps may be omitted or not performed without departing from the invention. Further, words such as "thereafter", "then", "next", "subsequently", etc. are not intended to limit the order of the steps. These words are simply used to guide the reader through the description of the exemplary method.

Additionally, one of ordinary skill in one or more of managing power, resources, and initializing a portable computing device is able to identify appropriate hardware and/or circuits and/or identify appropriate logic and determinations to implement the disclosed invention without difficulty based on the flow charts and associated description in this specification. Therefore, disclosure of a particular set of program code instructions, decision thresholds or detailed hardware devices is not considered necessary for an adequate understanding of how to make and use the invention. The inventive functionality and aspects of the claimed processor-enabled processes and circuit architectures are explained in more detail in the above description and in conjunction with the drawings, which may illustrate various process flows.

In one or more exemplary aspects as indicated above, the functions described may be implemented in hardware, software, firmware, or any combination thereof. If implemented in software, the functions may be stored as one or more instructions or code on a computer-readable medium, such as a non-transitory processor-readable medium. Computer-readable media include data storage media.

A storage media may be any available media that may be accessed by a computer or a processor. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of non-transitory computer-readable media.

Although selected aspects have been illustrated and described in detail, it will be understood that various substitutions and alterations may be made herein without departing from the present systems and methods, as defined by the following claims.

What is claimed is:

1. A method for calibrating an integrated analog current sensor in a computing device, the method comprising:
   applying power to an application processing system without enabling a clock network;
   recording a measure of a leakage current of a processing resource;
   recording at least one measured parameter for the processing resource;
   retrieving a baseline leakage current for the processing resource responsive to the at least one measured parameter;
   enabling the clock network, where the clock network is responsive to a first input signal and a second input signal to generate a dynamic load;
   measuring a load current with the integrated analog current sensor being calibrated;
   generating an estimate of the load current responsive to capacitance of the clock network, a clock frequency and an input voltage;
   calculating a total current applied responsive to the leakage current and the estimate of the load current;
   recording the total current applied and the load current;
   adjusting the second input signal to adjust the dynamic load; and
   repeating the measuring, generating, recording the total current applied and the load current, and adjusting steps a desired number of times.

2. The method of claim 1, wherein the at least one measured parameter is selected from the group consisting of temperature and supply voltage.

3. The method of claim 2, wherein the temperature is measured with a temperature sensor integrated in one of the application processing system and a graphics processing unit.

4. The method of claim 1, wherein the at least one measured parameter is recorded with the clock network disabled.

5. The method of claim 1, wherein the at least one measured parameter is recorded with the application processing system in a reset mode of operation.

6. The method of claim 1, wherein the first input signal is applied to an input of a phase-locked loop.

7. The method of claim 1, wherein the second input signal is applied to gating elements in the clock network.

8. The method of claim 1, wherein using the clock network includes waiting until a phase-locked loop lock condition is achieved before enabling clock logic in the clock network.

9. The method of claim 1, further comprising:
   before the recording the at least one measured parameter, verifying that the application processing system is in a power-on condition; and
   when the application processing system is not in the power-on condition,
   applying power to the application processing system.

10. The method of claim 1, further comprising:
    before the recording the at least one measured parameter, verifying that the clock network is in a disabled condition; and
    when the clock network is not in the disabled condition, disabling the clock network.

11. The method of claim 1, wherein the leakage current is a component of a first data point for a calibration.

12. The method of claim 11, wherein each instance of the total current applied identifies a component of a corresponding subsequent data point for the calibration.

13. The method of claim 12, wherein the calibration defines a piece-wise linear trace over a range of the integrated analog current sensor.

14. The method of claim 13, further comprising:
    performing a reset procedure.

15. A computing device, comprising:
    means for applying power to an application processing system without enabling a clock network configured to provide inputs to a processor of the application processing system;
    means for measuring a leakage current while the clock inputs to the processor of the application processing system are disabled;
    means for recording the leakage current of the processor;
    means for retrieving a baseline current load as a result of operation of the processor at a present temperature and input voltage;
    means for recording a total leakage current responsive to the leakage current and the baseline current load, the total leakage current corresponding to a first data point;
    means for enabling the clock network to apply an adjustable dynamic load;
    means for measuring a load current in an analog current sensor being calibrated, the means for measuring responsive to the adjustable dynamic load; and
    means for determining an applied current as a function of the total leakage current and the load current, the applied current corresponding to a second data point.

16. The computing device of claim 15, wherein the means for applying the adjustable dynamic load is responsive to a total capacitance of the clock network.

17. The computing device of claim 15, wherein the means for applying, the means for measuring, and the means for determining are used to generate subsequent data points.

18. The computing device of claim 17, further comprising:
    means for generating a piece-wise linear trace responsive to the first data point, the second data point and subsequent data points.

19. The computing device of claim 15, wherein the means for applying the adjustable dynamic load is responsive to a supply voltage and a clock frequency.

* * * * *